(12) United States Patent
Gupta

(10) Patent No.: US 6,469,538 B1
(45) Date of Patent: Oct. 22, 2002

(54) CURRENT MONITORING AND LATCHUP DETECTION CIRCUIT AND METHOD OF OPERATION

(75) Inventor: Vidyabhusan Gupta, Palo Alto, CA (US)

(73) Assignee: STMicroelectronics, Inc., Carrollton, TX (US)

(*) Notice: Subject to any disclaimer, the term of this patent is extended or adjusted under 35 U.S.C. 154(b) by 136 days.

(21) Appl. No.: 09/590,499

(22) Filed: Jun. 9, 2000

(51) Int. Cl.[7] .............................................. G01R 31/26
(52) U.S. Cl. .................................... 324/769; 324/158.1
(58) Field of Search ............................ 324/769, 207.16, 324/244, 251, 260, 158.1, 252; 327/421, 427, 510, 511

(56) References Cited

U.S. PATENT DOCUMENTS

| | | | | |
|---|---|---|---|---|
| 5,438,990 A | * | 8/1995 | Wahlstrand et al. | ... 324/207.16 |
| 5,489,846 A | * | 2/1996 | Li et al. | ...... 324/252 |
| 5,801,533 A | * | 9/1998 | Kalb, Jr. | ...... 324/251 |
| 6,051,441 A | * | 4/2000 | McDowell et al. | ......... 257/427 |

* cited by examiner

Primary Examiner—Michael Sherry
Assistant Examiner—Minh N. Tang
(74) Attorney, Agent, or Firm—Lisa K. Jorgenson; William A. Munck

(57) ABSTRACT

An apparatus for monitoring a load current drawn by an electrical circuit in a wire includes: 1) a Lorentz force MOS transistor having a first drain current (ID1) and a second drain current (ID2), wherein the Lorentz force MOS transistor is disposed proximate the wire carrying the load current and wherein a magnetic force generated by the load current increases a first current difference between the first drain current and a second drain current; 2) a current difference amplification circuit for detecting the first current difference between the first drain current and the second drain current and generating an amplified output signal; and 3) a current monitoring circuit coupled to the current difference amplification circuit capable of detecting and measuring the amplified output signal.

21 Claims, 5 Drawing Sheets

CURRENT MONITORING AND LATCHUP DETECTION CIRCUIT AND METHOD OF OPERATION

TECHNICAL FIELD OF THE INVENTION

The present invention is generally directed to a current monitoring circuit and, more specifically, to a circuit capable of detecting a latchup condition or other over-current condition using a magnetic field detection transistor (or magFET).

BACKGROUND OF THE INVENTION

The power and complexity of integrated circuits, such as microprocessor chips, random access memory (RAM) chips, application specific integrated circuit (ASIC) chips, and the like, has increased dramatically in the last twenty years. This complexity has increased the likelihood of a manufacturing defect occurring on the chip. It also has increased the likelihood that a poor chip design may make the integrated circuit more susceptible to error conditions, such as latch-up, during times when the integrated circuit is operating under adverse conditions, such as high noise, power supply over-voltage conditions, high temperature, and the like. A common technique for screening integrated circuits (IC) is to measure the $I_{DDQ}$ of an integrated circuit under test. $I_{DDQ}$ is the power supply current in a quiescent operating condition. Faulty integrated circuits have a different $I_{DDQ}$ signature compared to non-faulty integrated circuits.

To increase the reliability of integrated circuits and to detect error conditions and defective chips more rapidly, it is common practice to incorporate built-in self test (BIST) circuitry in many types of integrated circuits. However, adding built-in self test circuitry presents additional problems. As the level of sophistication of self-testing increases, so does the size and complexity of the BIST circuitry. This results in a tradeoff between silicon area and detection sensitivity. Furthermore, the BIST circuitry itself may cause errors. This is particularly true as the complexity of the BIST circuitry increases. Finally, it is essential that the built-in self test (BIST) circuitry be able to monitor voltages and currents in an integrated circuit without interfering with the operation of the circuits that are being tested.

Therefore, there is a need in the art for improved circuitry for detecting error conditions in integrated circuits. In particular, there is a need in the art for built-in self test (BIST) circuitry that is simple and reliable and yet capable of performing relatively complex and sensitive testing. More particularly, there is a need in the art for BIST circuitry that is capable of accurately and non-intrusively monitoring current levels in an integrated circuit.

SUMMARY OF THE INVENTION

To address the above-discussed deficiencies of the prior art, it is a primary object of the present invention to provide an apparatus for monitoring a load current drawn by an electrical circuit in a wire. In an advantageous embodiment of the present invention, the apparatus comprises: 1) a Lorentz force MOS transistor having a first drain current (ID1) and a second drain current (ID2), wherein the Lorentz force MOS transistor is disposed proximate the wire carrying the load current and wherein a magnetic force generated by the load current increases a first current difference between the first drain current and the second drain current; and 2) a current difference amplification circuit capable of detecting the first current difference between the first drain current and the second drain current and generating an amplified output signal.

According to one embodiment of the present invention, the apparatus further comprises a current monitoring circuit coupled to the current difference amplification circuit capable of detecting and measuring the amplified output signal.

According to another embodiment of the present invention, the current monitoring circuit compares the amplified output signal to a predetermined threshold level and generates an error signal if the amplified output signal exceeds the predetermined threshold level.

According to still another embodiment of the present invention, the apparatus further comprises a switch controlled by the current monitoring circuit capable of coupling the wire to a power supply.

According to yet another embodiment of the present invention, the current monitoring circuit opens the switch and measures the amplified output signal when the load current is zero to thereby determine an initial current difference reference.

According to a further embodiment of the present invention, the current monitoring circuit closes the switch and measures the amplified output signal to determine the first current difference.

According to a still further embodiment of the present invention, the Lorentz force MOS transistor is disposed within a loop formed by the wire.

According to a yet further embodiment of the present invention, the Lorentz force MOS transistor is disposed within a plurality of concentric loops formed by the wire.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged current monitoring circuit.

Figure 1:
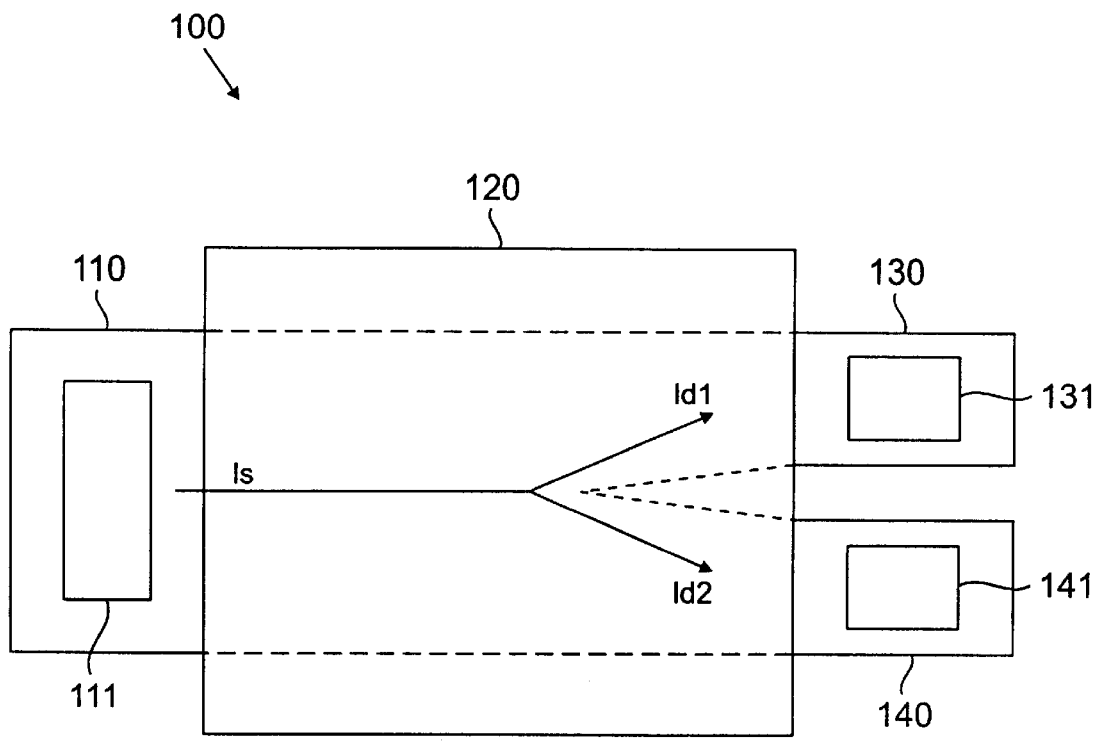
FIG. 1 illustrates an exemplary prior art magnetic field detection transistor (or MagFET)

FIG. 1 illustrates exemplary prior art magnetic field detection transistor (or magFET) 100. MagFET 100 comprises source 110, gate 120, drain 130 and drain 140. MagFET 100 is similar to a normal metal-oxide-silicon (MOS) transistor, except for the split drain. Source 110 contains contact pad 111, drain 130 contains contact pad 131, and drain 140 contains contact pad 141. Source current ($I_s$) flows from contact pad 111 towards contact pads 131 and 141 in the split drain. If no external magnetic field is applied, the source current splits evenly between the drains.

However, when an external magnetic field is generated by the current in a wire line or wire loop positioned near magFET 100, the Lorentz force created by the magnetic field causes an imbalance (or difference) in the drain currents, $I_{d1}$ and $I_{d2}$. The greater the magnitude of the current in the wire line or wire loop, the greater the magnitude of the magnetic field and the Lorentz force, and the greater the magnitude of the difference in the drain currents, $I_{d1}$ and $I_{d2}$. Lorentz force devices, such as magFET 100, are well known in the art. An exemplary Lorentz force MOSFET (LMOS) is discussed in "Micro IDDQ Test Using Lorentz Force MOSFETs," K. Nose and T. Sakurai, Proceedings of the 1999 Symposium on VLSI Circuits, IEEE, June 1999, pp. 169–170 (hereafter, the "Nose et al. reference"). The teachings of the Nose et al. reference are hereby incorporated by reference into the present application as if fully set forth herein.

Figure 2:
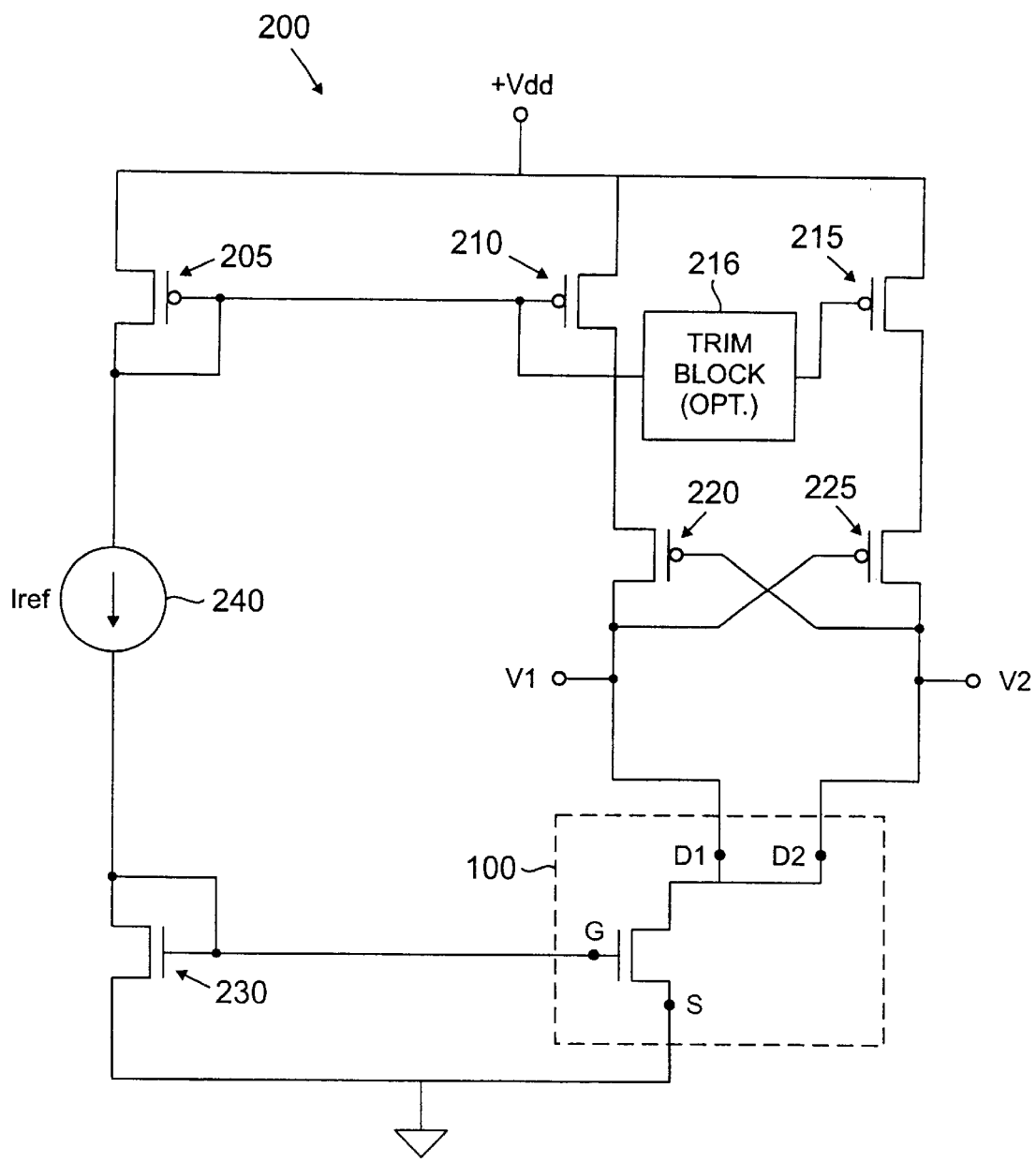
FIG. 2 illustrates a current difference detection circuit using the exemplary MagFET according to one embodiment of the present invention.

FIG. 2 illustrates exemplary current difference detection circuit 200 using exemplary magFET 100 according to one embodiment of the present invention. Current difference detection circuit 200 is designed to detect and amplify any difference in the drain currents, $I_{d1}$ and $I_{d2}$, in magFET 100. Current difference detection circuit 200 comprises p-type transistors 205, 210, 215, 220 and 225, n-type transistor 230, current source 240 and magFET 100, which also is an n-type transistor. The split drains 130 and 140 of magFET 100 are labeled D1 and D2, respectively.

Current source 240 creates a reference current, $I_{ref}$, that flows through transistor 205 and transistor 230. The gates of transistor 230 and magFET 100 are connected together, so that the same gate-to-source bias voltage, $V_{gs}$, appears across transistor 230 and magFET 100. This forces the drain-to-source current in magFET 100 to be equal to the drain-to-source current in transistor 230, namely $I_{ref}$. Thus, the sum of the split drain currents (i.e., $I_{d1}+I_{d2}$) is equal to $I_{ref}$. If no magnetic force is acting upon the gate of magFET 100, the drain currents, $I_{d1}$ and $I_{d2}$, are equal to each other, so that one-half of $I_{ref}$ flows into each drain of magFET 100. Thus, $\frac{1}{2}(I_{ref})$ flows through the circuit branch comprising transistors 210 and 220 and $\frac{1}{2}(I_{ref})$ flows through the circuit branch comprising transistors 215 and 225. Under these conditions, the voltages at nodes V1 and V2 are equal and the difference voltage, $\Delta V=V1-V2$, equals 0.

The difference between the drain currents, $I_{d1}$ and $I_{d2}$, does not have to be zero initially. In alternate circuit topologies, the drain currents $I_{d1}$, and $I_{d2}$ may initially be deliberately unbalanced, thereby creating an initial non-zero $\Delta V$ reference point. In one circuit topology, transistors 210 and 215 may be fabricated slightly differently, which creates an imbalance in the magnitudes of currents $I_{d1}$ and $I_{d2}$ through magFET 100. In an alternate circuit topology, (optional) trim block 216 may be inserted between the gates of transistors 210 and 215. Trim block 216 creates a slight voltage difference between the gates of transistors 210 and 215, thereby creating an imbalance in the magnitudes of currents $I_{d1}$ and $I_{d2}$ through magFET 100.

However, if a current-carrying wire is disposed on or near magFET 100, the current in the wire causes a magnetic field that creates (or increases) a difference in the drain currents, $I_{d1}$ and $I_{d2}$. Thus, the currents in the two current branches coupled to drains D1 and D2 are no longer equal and a voltage difference appears between nodes V1 and V2. The greater the current in the wire overlaid on or near magFET 100, the greater the magnetic field caused by the wire and the greater the difference in the drain currents, $I_{d1}$ and $I_{d2}$. As the difference between $I_{d1}+I_{d2}$ grows, the difference is amplified to an even greater degree in $\Delta V=V1-V2$. In cases where transistors 210 and 215 are fabricated differently or trim block 216 is used, the initial imbalance in the magnitudes of currents $I_{d1}$ and $I_{d2}$ through magFET 100 may be overcome by the magnetically induced current difference, thereby causing a difference in the state of the circuit and indicating an over-current condition.

In the exemplary embodiment shown in FIG. 2, current difference detection circuit 200 comprises only a single magFET capable of detecting current in a wire. However, in alternate embodiments of the present invention, current difference detection circuit 200 may comprise two or more magFETs similar to magFET 100 that are coupled in series or in parallel, or in a combination of series and parallel magFETs.

Figure 3:
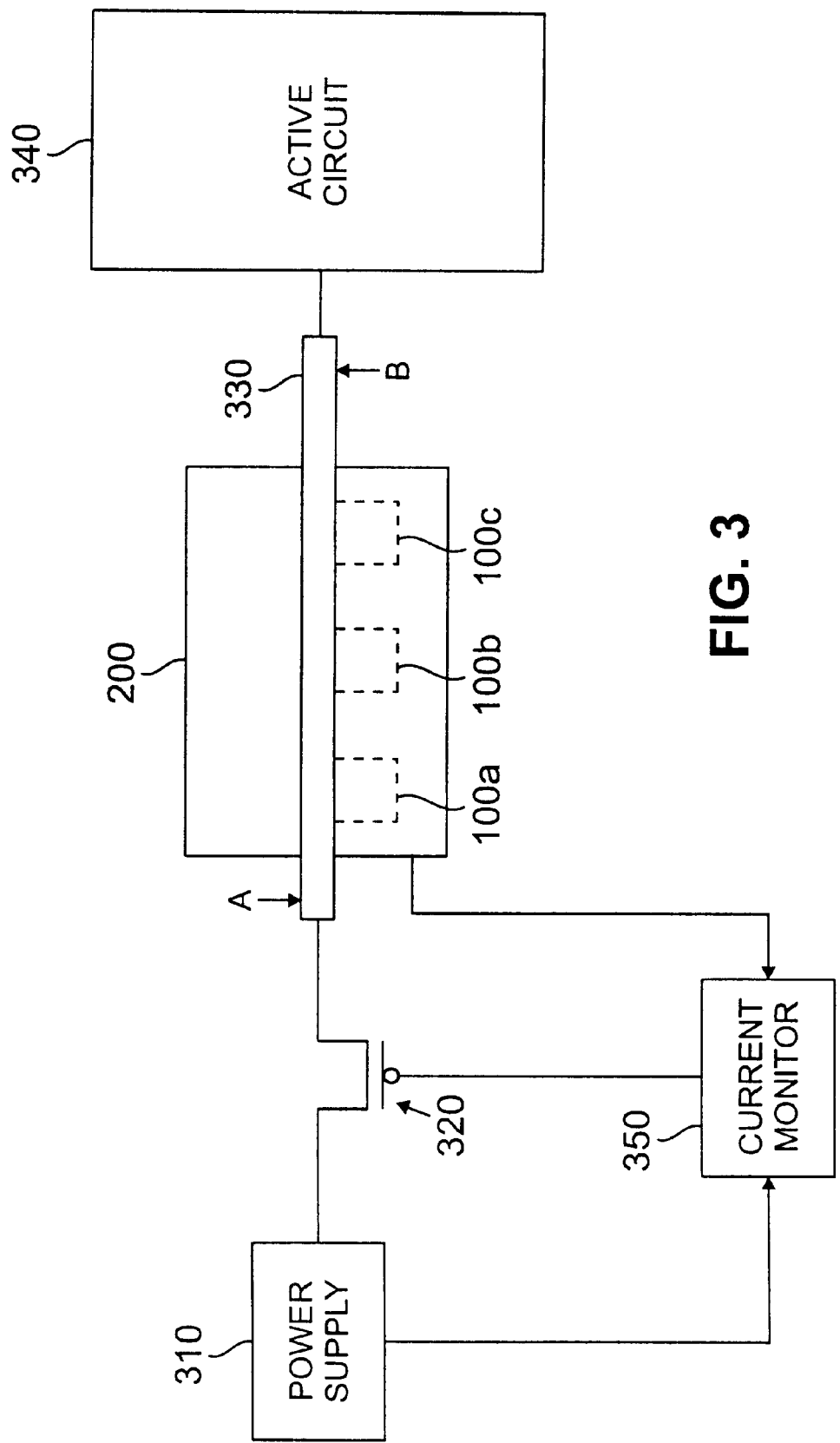
FIG. 3 illustrates a monitoring circuit capable of monitoring the current drawn by an active circuit and detecting a latchup or other over-current condition, according to one embodiment of the present invention.

FIG. 3 illustrates exemplary integrated circuit (IC) 300, which contains monitoring circuitry that monitors the current drawn by active circuit 340 and detects a latchup or other over-current condition, according to one embodiment of the present invention. Integrated circuit 300 comprises power supply 310, which supplies power to active circuit 340 via wire 330 and switch 320. Active circuit 340 is not intended to be any particular type of electronic circuit. Wire 330 is formed by the metallization layers in the semiconductor. Active circuit 340 may be the CPU logic of a microprocessor, a random access memory (RAM), a digital signal processor, a radio frequency (RF) transceiver, or the like.

The monitoring circuitry comprises current difference detection circuit 200, current monitor 350, and switch 320. These elements monitor the level of current in wire 330 in order to detect a latch-up or other over-current condition. Current difference detection circuit 200 comprises a plurality of magFETs for detecting current in wire 330, including exemplary magFET 100a, exemplary magFET 100b, and exemplary magFET 100c, which may be arranged in parallel, in series, or in a parallel and series combination. When switch 320 is closed, current flows from power supply 310 to active circuit 340 through wire 330 (i.e., from node A to node B). The current in wire 330 creates a magnetic field that is sensed by magFETs 100a–c, which produce a difference voltage signal, $\Delta V$, that is read by current monitor 350. Current monitor 350 comprises processing circuitry capable of measuring and storing the difference voltage $\Delta V$, comparing it to one or more predetermined threshold values, and determining whether or not a latch-up or other over-current condition exists. The greater the value of $\Delta V$, the more likely a latch-up or over-current condition exists.

Figure 4A:
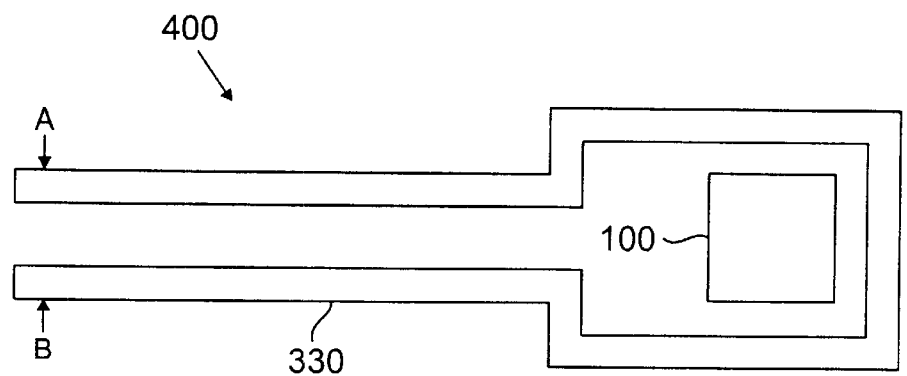
FIGS. 4A and 4B illustrate different configurations of current-carrying wires monitored by the exemplary MagFET according to alternate embodiments of the present invention.
Figure 4B:
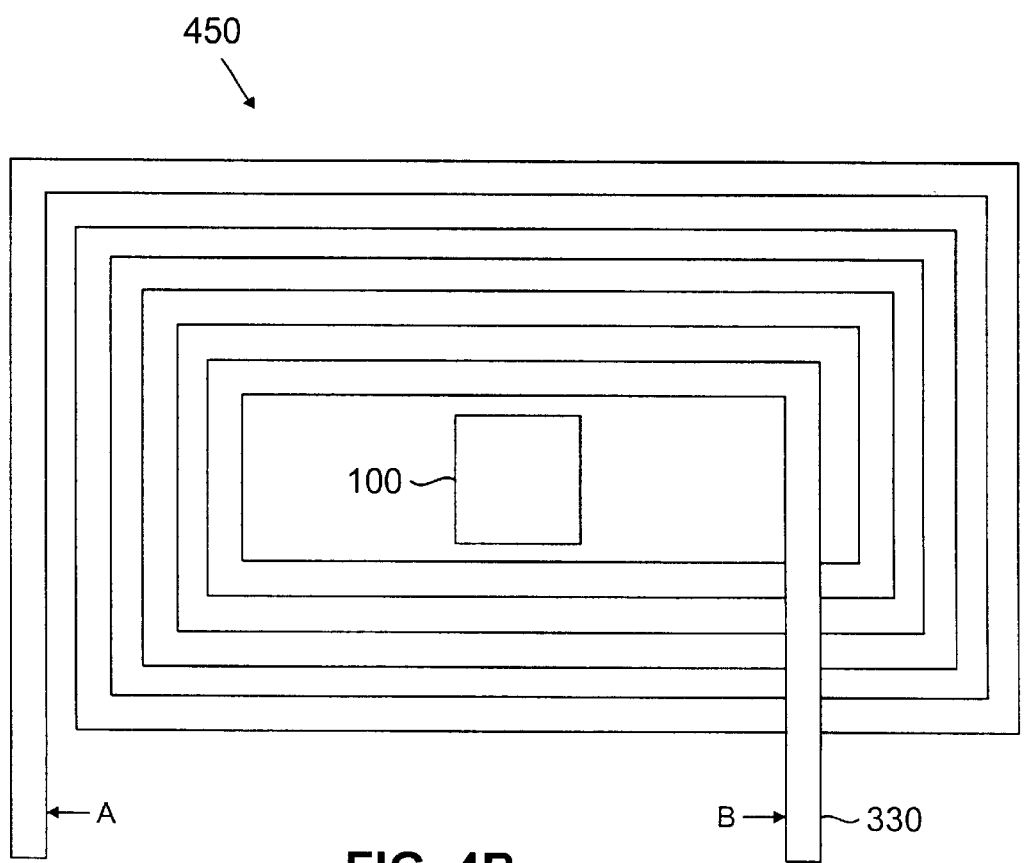

FIGS. 4A and 4B illustrate different configurations 400 and 450 of current-carrying wire 330 monitored by exemplary magFET 100 according to alternate embodiments of the present invention. The magnetic field created in magFET 100 by the current in wire 330 may be increased by looping the wire around magFET 100 as shown in FIRE 4A. Current flows from node A to node B and creates a larger magnetic field because of the amount of wire in close proximity to magFET 100. Increasing the magnetic field increases the magnitude of the difference voltage signal, $\Delta V$, that is read by current monitor 350. FIG. 4B shows a more extreme example. Current in wire 330 flows from node A to node B and makes many loops around magFET 100. Each loop adds to the size of the magnetic field and, therefore, increases the magnitude of the difference voltage signal, $\Delta V$, read by current monitor 350.

Figure 5:
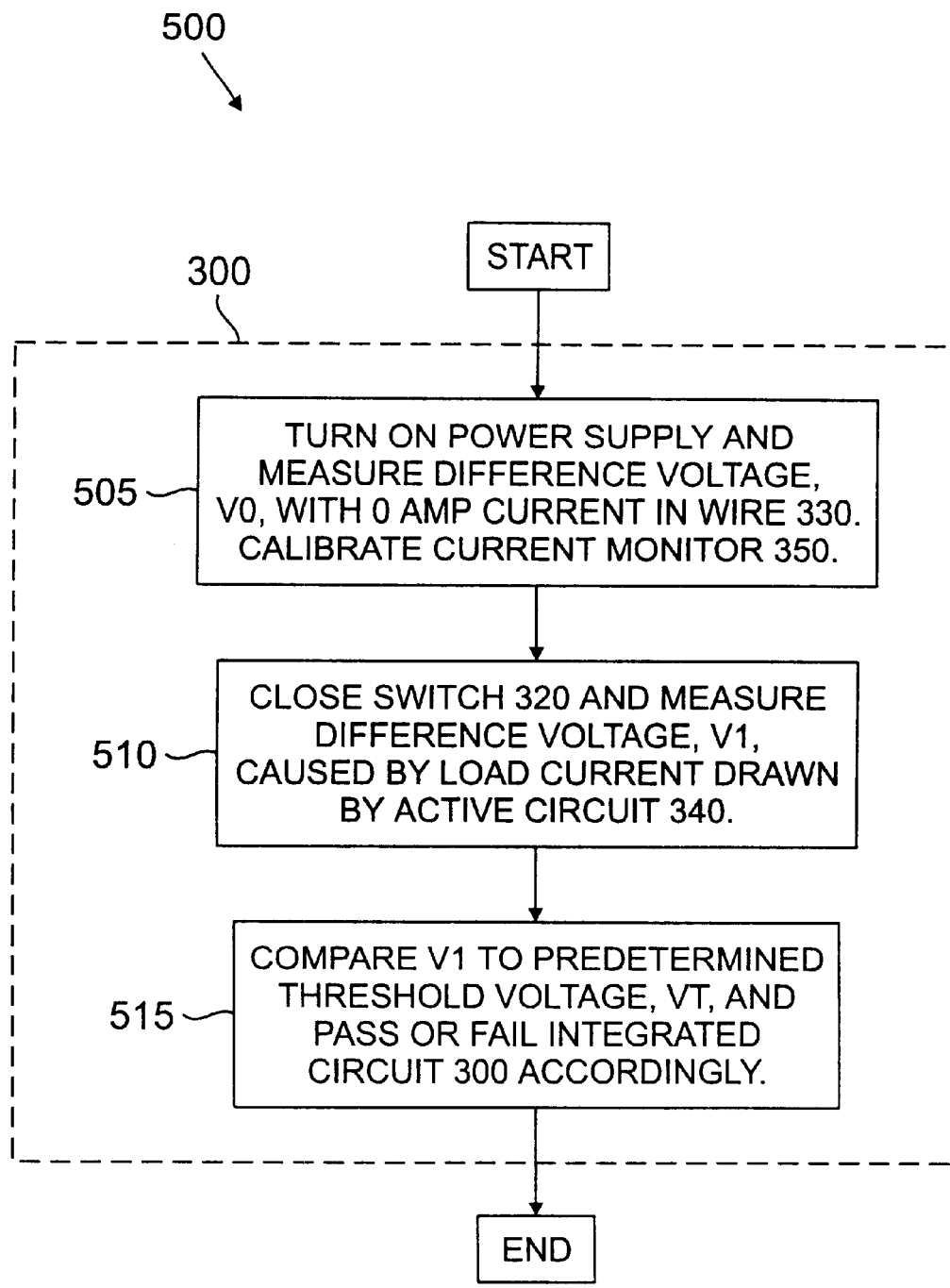
FIG. 5 is a flow diagram illustrating the operation of the exemplary monitoring circuit in FIG. 3 according to one embodiment of the present invention.

FIG. 5 depicts flow diagram 500, which illustrates the operation of exemplary monitoring circuit 300 according to one embodiment of the present invention. Initially, no power is applied to integrated circuit 300 and switch 320 is open. When power is applied, power supply 310 comes on and provides power to current monitor 350 and current difference detection circuit 200. Current monitor 350 then measures the difference voltage, V0, from current difference detection circuit 200 when no current is flowing in wire 330. This permits calibration of current monitor 350 for no load conditions (process step 505).

Next, current monitor 350 closes switch 320 so that current flows through wire 330 and into active circuit 340. The load current in wire 330 drawn by active circuit 340 creates a magnetic field that causes drain current differences in one or more of magFETs 100a–c100c. The current differences are detected by current difference detection circuit 200, which generates a corresponding difference voltage, V1, that is measured by current monitor 300 (process step 510). Finally, current monitor 300 compares the measured difference voltage, V1 to a predetermined threshold voltage, VT, and passes or fails integrated circuit 300 by generating an error (or fail) signal or a pass signal accordingly (process step 515).

Although the present invention has been described in detail, those skilled in the art should understand that they can make various changes, substitutions and alterations herein without departing from the spirit and scope of the invention in its broadest form.

What is claimed is:

1. An apparatus for monitoring a load current drawn by an electrical circuit in a wire, said apparatus comprising:
    a Lorentz force MOS transistor having a first drain current (ID1) and a second drain current (ID2), wherein said Lorentz force MOS transistor is disposed proximate said wire carrying said load current and wherein a magnetic force generated by said load current increases a first current difference between said first drain current and said second drain current; and
    a current detection circuit coupled to said Lorentz force MOS transistor and capable of generating a differential output voltage representative of a magnitude of said load current.

2. The apparatus as set forth in claim 1 wherein said current detection circuit further comprises:
    a current difference amplification circuit capable of detecting said first current difference between said first drain current and said second drain current and generating an amplified output; and
    a current monitoring circuit coupled to said current difference amplification circuit and capable of detecting and measuring said amplified output signal to generate said differential output voltage.

3. The apparatus as set forth in claim 1 wherein said Lorentz force MOS transistor is disposed within a loop formed by said wire.

4. The apparatus as set forth in claim 3 wherein said Lorentz force MOS transistor is disposed within a plurality of concentric loops formed by said wire.

5. An apparatus for monitoring a load current drawn by an electrical circuit in a wire, said apparatus comprising:
    a Lorentz force MOS transistor having a first drain current (ID1) and a second drain current (ID2), wherein said Lorentz force MOS transistor is disposed proximate said wire carrying said load current and wherein a magnetic force generated by said load current increases a first current difference between said first drain current and said second drain current;
    a current difference amplification circuit capable of detecting said first current difference between said first drain current and said second drain current and generating an amplified output signal; and
    a current monitoring circuit coupled to said current difference amplification circuit capable of detecting and measuring said amplified output signal,
    wherein said current monitoring circuit compares said amplified output signal to a predetermined threshold level and generates an error signal if said amplified output signal exceeds said predetermined threshold level.

6. The apparatus as set forth in claim 5 further comprising a switch controlled by said current monitoring circuit capable of coupling said wire to a power supply.

7. The apparatus as set forth in claim 6 wherein said current monitoring circuit opens said switch and measures said amplified output signal when said load current is zero to thereby determine an initial current difference reference.

8. The apparatus as set forth in claim 7 wherein said current monitoring circuit closes said switch and measures said amplified output signal to determine said first current difference.

9. An integrated circuit comprising:
an electrical circuit capable of drawing a load current when said electrical circuit is active;
a power supply capable of supplying said load current to said electrical circuit;
a power supply wire for carrying said load current from said power supply to said electrical circuit; and
an apparatus for monitoring said load current drawn by said electrical circuit in said power supply wire, said apparatus comprising:
a Lorentz force MOS transistor having a first drain current (ID1) and a second drain current (ID2), wherein said Lorentz force MOS transistor is disposed proximate said power supply wire carrying said load current and wherein a magnetic force generated by said load current increases a first current difference between said first drain current and said second drain current; and
a current detection circuit coupled to said Lorentz force MOS transistor and capable of generating a differential output voltage representative of a magnitude of said load current.

10. The integrated circuit as set forth in claim 9 wherein said current detection circuit further comprises:
a current difference amplification circuit capable of detecting said first current difference between said first drain current and said second drain current and generating an amplified output; and
a current monitoring circuit coupled to said current difference amplification circuit and capable of detecting and measuring said amplified output signal to generate said differential output voltage.

11. The integrated circuit as set forth in claim 9 wherein said Lorentz force MOS transistor is disposed within a loop formed by said power supply wire.

12. The integrated circuit as set forth in claim 11 wherein said Lorentz force MOS transistor is disposed within a plurality of concentric loops formed by said power supply wire.

13. An integrated circuit comprising:
an electrical circuit capable of drawing a load current when said electrical circuit is active;
a power supply capable of supplying said load current to said electrical circuit;
a power supply wire for carrying said load current from said power supply to said electrical circuit; and
an apparatus for monitoring said load current drawn by said electrical circuit in said power supply wire, said apparatus comprising:
a Lorentz force MOS transistor having a first drain current (ID1) and a second drain current (ID2), wherein said Lorentz force MOS transistor is disposed proximate said wire carrying said load current and wherein a magnetic force generated by said load current increases a first current difference between said first drain current and said second drain current;
a current difference amplification circuit capable of detecting said first current difference between said first drain current and said second drain current and generating an amplified output signal; and
a current monitoring circuit coupled to said current difference amplification circuit capable of detecting and measuring said amplified output signal,
wherein said current monitoring circuit compares said amplified output signal to a predetermined threshold level and generates an error signal if said amplified output signal exceeds said predetermined threshold level.

14. The integrated circuit as set forth in claim 13 further comprising a switch controlled by said current monitoring circuit capable of coupling said power supply wire to a power supply.

15. The integrated circuit as set forth in claim 14 wherein said current monitoring circuit opens said switch and measures said amplified output signal when said load current is zero to thereby determine an initial current difference reference.

16. The integrated circuit as set forth in claim 15 wherein said current monitoring circuit closes said switch and measures said amplified output signal to determine said first current difference.

17. A method for monitoring a load current in a power supply wire coupling a power supply and electrical circuit, wherein the wire is disposed proximate a Lorentz force MOS transistor having a first drain current (ID1) and a second drain current (ID2), the method comprising the steps of:
opening a switch coupling the power supply and the electrical circuit to thereby set the load current to zero;
detecting an initial current difference between the first drain current and the second drain current;
closing the switch to thereby establish a non-zero load current, the non-zero load current generating a magnetic force that creates a first current difference between the first drain current and the second drain current;
detecting the first current difference between the first drain current and the second drain current; and
generating an output signal corresponding to the first current difference.

18. The method as set forth in claim 17 wherein the steps of detecting the first current difference and generating the output signal comprises the sub-steps of amplifying the first current difference in a differential amplifier stage and generating a differential output voltage corresponding to the first current difference.

19. The method as set forth in claim 17 wherein the Lorentz force MOS transistor is disposed within a loop formed by the power supply wire.

20. The method as set forth in claim 19 wherein the Lorentz force MOS transistor is disposed within a plurality of concentric loops formed by the power supply wire.

21. A method for monitoring a load current in a power supply wire coupling a power supply and electrical circuit, wherein the wire is disposed proximate a Lorentz force MOS transistor having a first drain current (ID1) and a second drain current (ID2), the method comprising the steps of:
opening a switch coupling the power supply and the electrical circuit to thereby set the load current to zero;
detecting an initial current difference between the first drain current and the second drain current;
closing the switch to thereby establish a non-zero load current, the non-zero load current generating a magnetic force that creates a first current difference between the first drain current and the second drain current;
detecting the first current difference between the first drain current and the second drain current;
generating an output signal corresponding to the first current difference;
comparing the amplified output signal to a predetermined threshold level; and
generating an error signal if the amplified output signal exceeds the predetermined threshold level.

* * * * *